United States Patent
Nguyen et al.

(10) Patent No.: US 9,355,024 B2
(45) Date of Patent: May 31, 2016

(54) SYSTEMS AND METHODS FOR NONVOLATILE MEMORY PERFORMANCE THROTTLING

(71) Applicant: Apple Inc., Cupertino, CA (US)

(72) Inventors: Kevin M. Nguyen, San Jose, CA (US); David J. Yeh, San Jose, CA (US); Cheng P. Tan, Fremont, CA (US); Anthony Fai, Palo Alto, CA (US)

(73) Assignee: APPLE INC., Cupertion, CA (US)

( * ) Notice: Subject to any disclaimer, the term of this patent is extended or adjusted under 35 U.S.C. 154(b) by 811 days.

(21) Appl. No.: 13/648,375

(22) Filed: Oct. 10, 2012

(65) Prior Publication Data
US 2014/0101371 A1   Apr. 10, 2014

(51) Int. Cl.
| | |
|---|---|
| G06F 1/20 | (2006.01) |
| G06F 3/06 | (2006.01) |
| G06F 11/30 | (2006.01) |
| G06F 12/02 | (2006.01) |
| G11C 7/04 | (2006.01) |
| G11C 16/34 | (2006.01) |

(52) U.S. Cl.
CPC ............ G06F 12/0246 (2013.01); G06F 1/206 (2013.01); G06F 3/0616 (2013.01); G06F 3/0634 (2013.01); G06F 3/0679 (2013.01); G11C 16/3495 (2013.01); G06F 11/3058 (2013.01); G06F 2212/7204 (2013.01); G11C 7/04 (2013.01)

(58) Field of Classification Search
CPC ...... G06F 1/206; G06F 3/0616; G06F 3/0634; G06F 3/0679; G06F 11/3058; G06F 12/0246; G06F 2212/7204; G11C 7/04; G11C 16/3495
See application file for complete search history.

(56) References Cited

U.S. PATENT DOCUMENTS

| | | | |
|---|---|---|---|
| 7,797,506 B2* | 9/2010 | Rangarajan et al. | 711/170 |
| 2011/0173378 A1 | 7/2011 | Filor et al. | |
| 2011/0219203 A1* | 9/2011 | Nurminen et al. | 711/165 |
| 2012/0124273 A1 | 5/2012 | Goss et al. | |

FOREIGN PATENT DOCUMENTS

| | | |
|---|---|---|
| EP | 2495728 | 9/2012 |
| TW | I339842 | 4/2011 |

* cited by examiner

*Primary Examiner* — Gary W Cygiel
(74) *Attorney, Agent, or Firm* — Van Court & Aldridge LLP

(57) ABSTRACT

Systems and methods for nonvolatile memory ("NVM") performance throttling are disclosed. Performance of an NVM system may be throttled to achieve particular data retention requirements. In particular, because higher storage temperatures tend to reduce the amount of time that data may be reliably stored in an NVM system, performance of the NVM system may be throttled to reduce system temperatures and increase data retention time.

17 Claims, 7 Drawing Sheets

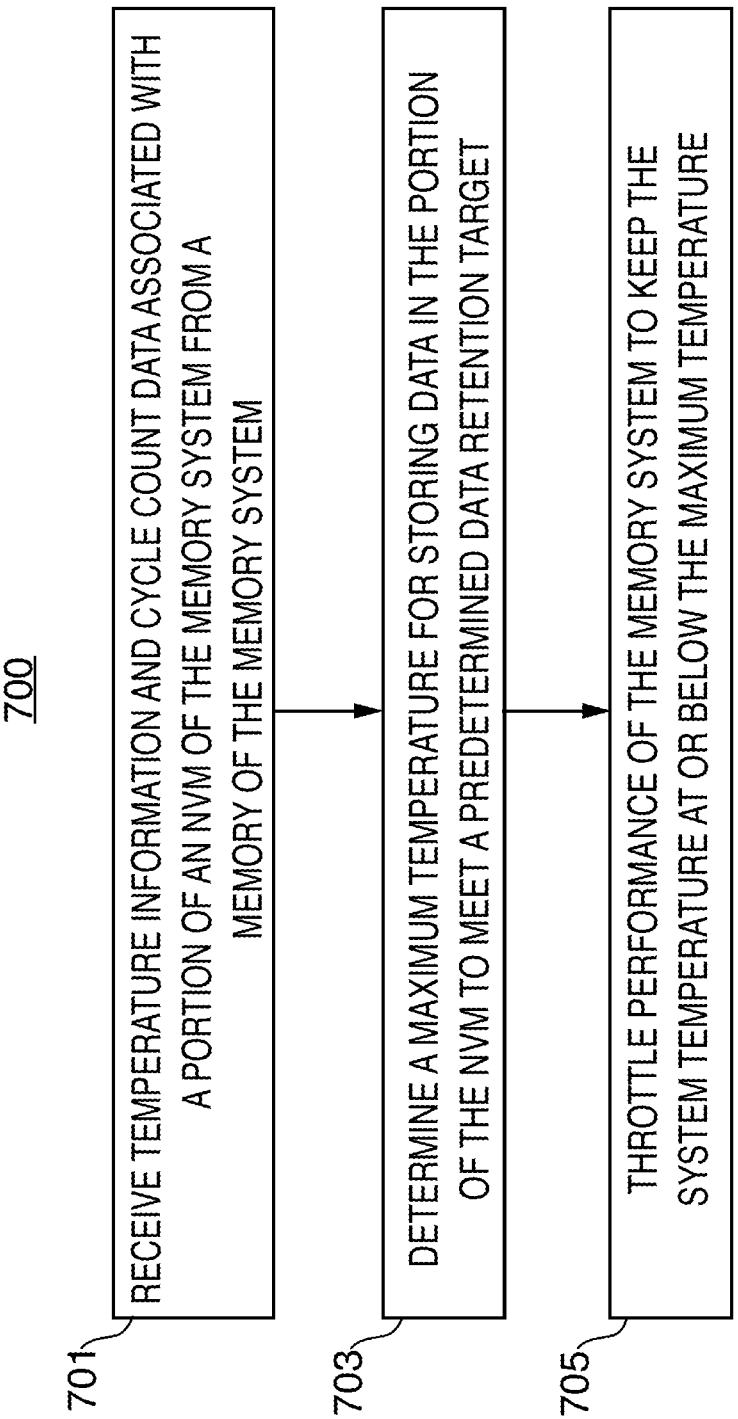

SYSTEMS AND METHODS FOR NONVOLATILE MEMORY PERFORMANCE THROTTLING

BACKGROUND OF THE DISCLOSURE

Various types of nonvolatile memory ("NVM"), such as flash memory (e.g., NAND flash memory and NOR flash memory), can be used for mass storage. For example, consumer electronics (e.g., portable media players) use flash memory to store data, including music, videos, images, and other media or types of information.

NVM data retention tends to decrease as lithography design rules shrink. Usage, time, and temperature of the NVM also tend to adversely affect data retention.

SUMMARY OF THE DISCLOSURE

Systems and methods for nonvolatile memory performance throttling are disclosed. Performance of an NVM system may be throttled based upon a predictive model that can incorporate temperature, time, and usage data. The predictive model may determine how long data can be reliably stored in the NVM at a given temperature and/or a maximum temperature at which the NVM can be operated to achieve desired data retention characteristics. Based upon the data retention characteristics determined using the predictive model, performance of the NVM system can be throttled to ensure that data is retained in the NVM for a desired length of time.

BRIEF DESCRIPTION OF THE DRAWINGS

The above and other aspects of the invention, its nature, and various features will become more apparent upon consideration of the following detailed description, taken in conjunction with the accompanying drawings, in which like reference characters refer to like parts throughout, and in which:

FIG. 7 is a flowchart of an illustrative process for NVM performance throttling in accordance with various embodiments.

DETAILED DESCRIPTION OF THE DISCLOSURE

Systems and methods for nonvolatile memory performance throttling are disclosed.

Data retention in NVM systems can be inversely proportional to temperature, usage (e.g., cycle count), and time elapsed since the NVM was last programmed. Aggressive design rules for modern NVMs, which can help to increase NVM storage density, can also tend to adversely affect NVM data retention. In particular, in NAND NVM systems, all of the above factors can lead to charge loss from the floating gate, and, over time, such charge loss may result in loss of data unless mitigating measures are taken.

A number of data management techniques can be used to prevent data loss in the presence of errors detected in an NVM (e.g., Error Checking and Correction ("ECC") code) and to extend the useful life of the NVM (e.g., wear leveling). However, such solutions may not be suitable for actively managing NVM performance to achieve particular data retention requirements. Active management of data retention can help to ensure that data retention for NVMs with aggressively scaled design rules remains on par with less aggressively scaled NVM designs. Additionally, such active management can preserve data integrity while reducing how frequently traditional data management techniques such as garbage collection and refresh are performed.

Active management of data retention may rely on throttling NVM performance. According to some embodiments, NVM performance may be throttled by reducing the number of active NVM dies and thereby reducing the operating and/or storage temperature of the NVM and prolonging data retention. The number of active dies in an NVM system may be reduced, for example, while the system is in an idle or relatively inactive mode, thus reducing the storage temperature and increasing data retention. In periods of high activity, however, the number of active dies may be increased such that a user of the system does not perceive performance degradation. The determination of whether to implement performance throttling in a particular NVM system may depend on a number of factors, including the data retention characteristics of the particular NVM, cycle counts and time elapsed since the last programming of particular portions of the NVM, as well as general and localized temperature profiles of the NVM system.

Figure 1:
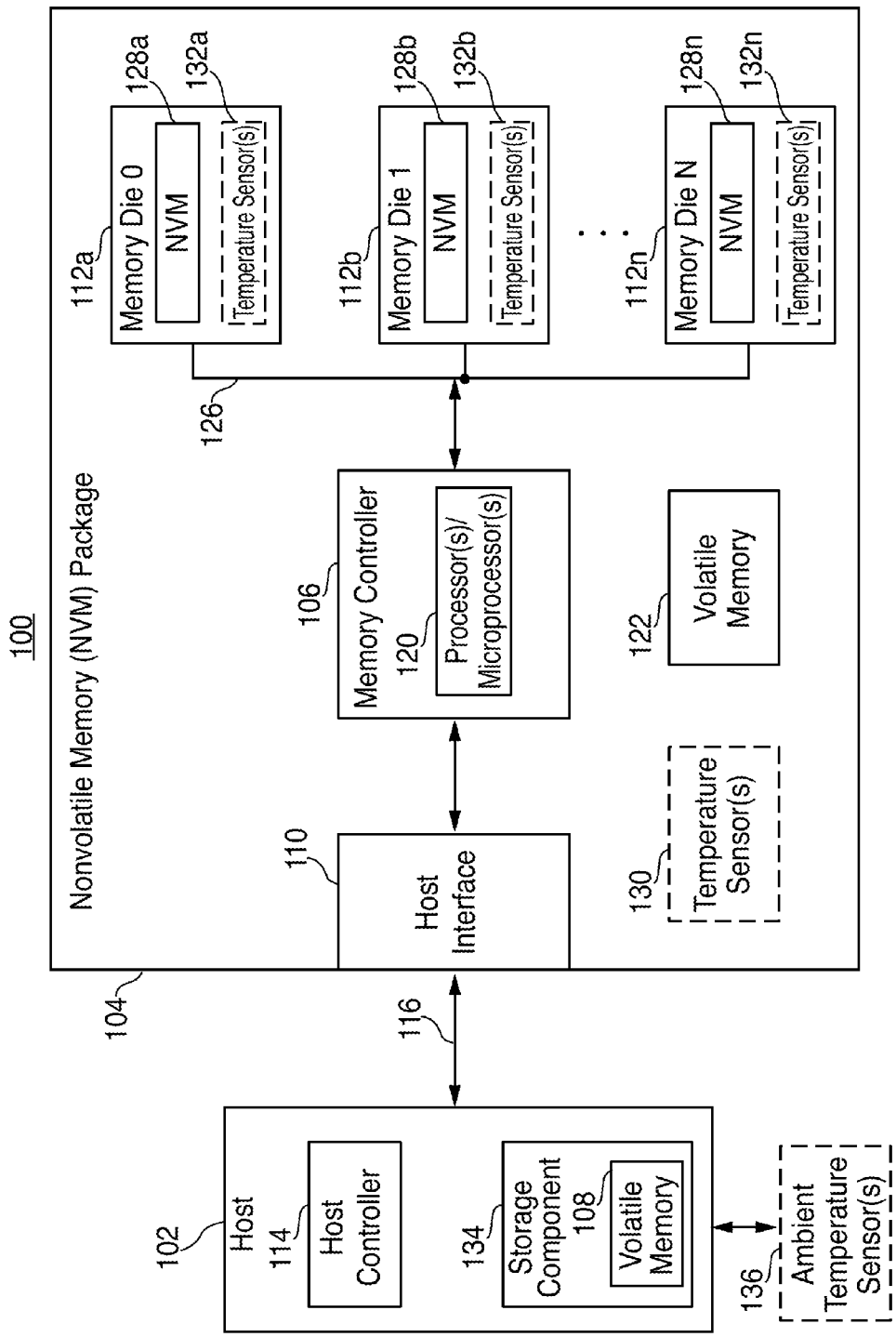
FIG. 1 is a diagram depicting an illustrative system that includes a host and an NVM package with a memory controller in accordance with various embodiments.

FIG. 1 is a diagram depicting system 100, including NVM package 104 and host 102. Host 102 may be configured to provide memory access requests (e.g., read, write, and erase commands) to NVM package 104, which can include memory controller 106, host interface 110, and NVM dies 112a-n with corresponding NVMs 128a-n.

Host 102 can be any of a variety of host devices and/or systems, such as a portable media player, a cellular telephone, a pocket-sized personal computer, a personal digital assistant ("PDA"), a desktop computer, a laptop computer, and/or a tablet computing device. NVM package 104 can include NVMs 128a-n (e.g., in NVM dies 112a-n) and can be a ball grid array package or other suitable type of integrated circuit ("IC") package. NVM package 104 can be part of and/or separate from host 102. For example, host 102 can be a board-level device and NVM package 104 can be a memory subsystem that is installed on the board-level device. In other embodiments, NVM package 104 can be coupled to host 102 with a wired (e.g., SATA) or wireless (e.g., Bluetooth™) interface.

Host 102 can include host controller 114 that is configured to interact with NVM package 104. For example, host 102 can transmit various access requests, such as read, write, and erase commands, to NVM package 104. Host controller 114 can include one or more processors and/or microprocessors that are configured to perform operations based on the execution of software and/or firmware instructions. Additionally or alternatively, host controller 114 can include hardware-based components, such as application-specific integrated circuits ("ASICs"), that are configured to perform various operations. Host controller 114 can format information (e.g., commands and/or data) transmitted to NVM package 104 according to a communications protocol shared between host 102 and NVM package 104.

Host controller 114 can obtain temperature measurements for system 100 from one or more ambient temperature sensors 136. Temperature sensor 136 is depicted in FIG. 1 as a dashed box to illustrate that it can be located in any suitable location, such as, for example, on a board and/or affixed to a housing of system 100. Ambient temperature sensors 136 may be used by host controller 114 (or other component of system 100) to determine the external temperature of the host.

Host 102 can include volatile memory 108. Volatile memory 108 can be any of a variety of volatile memory types, such as cache memory or RAM. Host 102 can use volatile memory 108 to perform memory operations and/or to temporarily store data that is being read from and/or written to NVM package 104. For example, volatile memory 108 can temporarily store a set of access requests to be sent to, or to store data received from, NVM package 104.

Host 102 can communicate with NVM package 104 over communications channel 116 using host interface 110 and memory controller 106. Communications channel 116 can be any bus suitable for bidirectional communications. Communications channel 116 can be fixed, detachable, or wireless. Communications channel 116 can be, for example, a universal serial bus (USB), serial advanced technology (SATA) bus, or any other suitable bus.

Memory controller 106 can include one or more processors and/or microprocessors 120 that are configured to perform operations based on the execution of software and/or firmware instructions. Additionally or alternatively, memory controller 106 can include hardware-based components, such as ASICs, that are configured to perform various operations. Memory controller 106 can perform a variety of operations, such as dispatching commands issued by host 102.

Host controller 114 and memory controller 106, alone or in combination, can perform various memory management functions, such as garbage collection and wear leveling. In implementations where memory controller 106 is configured to perform at least some memory management functions, NVM package 104 can be termed "managed NVM" (or "managed NAND" for NAND flash memory). This can be in contrast to "raw NVM" (or "raw NAND" for NAND flash memory), in which host controller 114, external to NVM package 104, performs memory management functions for NVM package 104.

In some embodiments, host controller 114 and memory controller 106 can be part of the same memory device. Although there can be overlap, host controller 114 and memory controller 106 can perform different roles. For example, host controller 114 may perform and provide user-facing functionality for the memory device, such as performing operations to provide a user interface and responding to user input (e.g., requests to play a particular media file). Memory controller 106 may perform and provide memory-based functionality for the memory device, such as implementing memory access requests from host controller 114 (e.g., converting from logical to physical addressing), performing memory management operations, and/or performing ECC operations.

As depicted in FIG. 1, memory controller 106 can be incorporated into the same package as NVM dies 112a-n. In other embodiments, memory controller 106 may be physically located in a separate package or in the same package as host 102. In some embodiments, memory controller 106 may be omitted, and all memory management functions that are normally performed by memory controller 106 (e.g., garbage collection and wear leveling) can be performed by a host controller (e.g., host controller 114).

NVM package 104 may include volatile memory 122. Volatile memory 122 can be any of a variety of volatile memory types, such as cache memory or RAM. Memory controller 106 can use volatile memory 122 to perform access requests and/or to temporarily store data that is being read from and/or written to NVMs 128a-n in NVM dies 112a-n. For example, volatile memory 122 can store firmware and memory controller 106 can use the firmware to perform operations on NVM package 104 (e.g., read/program operations). In some embodiments, volatile memory 122 can be included within memory controller 106.

Memory controller 106 can obtain temperature measurements for NVM package 104 from one or more temperature sensors 130. Temperature sensor 130 is depicted in FIG. 1 as a dashed box to illustrate that it can be located in any suitable location, such as, for example, on a board, within memory controller 106, and/or affixed to the packaging of NVM package 104. Temperature sensors 130 may be used by memory controller 106 (or other component of system 100) to determine the environmental temperature of NVM package 104.

Memory controller 106 can use shared internal bus 126 to access NVMs 128a-n and can use NVMs 128a-n to persistently store a variety of information, such as debug logs, instructions, and firmware that NVM package 104 uses to operate. Although only one shared internal bus 126 is depicted in NVM package 104, an NVM package can include more than one shared internal bus. Each internal bus can be connected to multiple (e.g., 2, 3, 4, 8, 32, etc.) memory dies as depicted with regard to NVM dies 112a-n. NVM dies 112a-n can be physically arranged in a variety of configurations, including a stacked configuration, and may be, according to some embodiments, integrated circuit ("IC") dies.

NVMs 128a-n can be any of a variety of NVM, such as NAND flash memory based on floating gate or charge trapping technology, NOR flash memory, erasable programmable read only memory ("EPROM"), electrically erasable programmable read only memory ("EEPROM"), ferroelectric RAM ("FRAM"), magnetoresistive RAM ("MRAM"), phase change memory ("PCM"), or any combination thereof.

NVMs 128a-n can be organized into "blocks", which can the smallest erasable unit, and further organized into "pages", which can be the smallest unit that can be programmed or read. In some embodiments, NVMs 128a-n can include multiple integrated circuits, where each integrated circuit may have multiple blocks. Memory locations (e.g., blocks or pages of blocks) from corresponding integrated circuits may form "super blocks". Each memory location (e.g., page or block) of NVMs 128a-n can be referenced using a physical address (e.g., a physical page address or physical block address).

NVM dies 112a-n can also each include one or more temperature sensors 132a-n located in and/or around NVMs 128a-n. Temperature sensors 132a-n are depicted in FIG. 1 as dashed boxes to illustrate that they can be located in any suitable location, such as, for example, spaced throughout the die to provide temperature measurements corresponding to NVMs 128a-n. The temperature measurements from temperature sensors 132a-n can be provided to memory controller 106 over shared internal bus 126 and/or one or more other internal channels (not shown) between NVM dies 112a-n and memory controller 106. The temperature measurements from temperature sensors 132a-n may be used to determine the temperature of a portion of NVM. This temperature information may be used in a variety of ways. For example, temperature information may be stored to determine whether performance throttling should be implemented to achieve data retention targets.

Temperature data may indicate the temperature of various portions of NVM dies 112a-n, such as NVMs 128a-n, and/or the individual blocks, pages, and/or memory cells thereof. In particular, depending on the location and placement of temperature sensors 132a-n, any suitable degree of granularity in the temperature measurements may be achieved. For example, a larger number of temperature sensors within each one of NVM dies 112a-n may allow for the collection of more detailed temperature data about portions of NVMs 128a-n. In some embodiments, temperature data about a particular portion of NVMs 128a-n may be inferred from data read from a number of temperature sensors 132a-n. Temperature data from temperature sensors 132a-n may be read at any suitable interval including continuously, intermittently, and/or upon the occurrence of a predetermined event (e.g., a read, program, or erase operation).

According to some embodiments, the temperature data collected from temperature sensors 132a-n may be used to form a temperature profile for NVMs 128a-n and/or any suitable portion of NVMs 128a-n. As used herein, a "temperature profile" can refer to a series of temperature readings for at least a portion of an NVM taken over a period of time. For example, a system-wide temperature profile may be formed for NVM package 104 as a whole. Alternatively or additionally, separate temperature profiles may be formed for portions of NVMs 128a-n with any suitable granularity. For instance, separate temperature profiles may be stored for portions of NVMs 128a-n corresponding to each of NVM dies 112a-n, each block within NVMs 128a-n, each page within NVMs 128a-n, each memory cell within NVMs 128a-n, and/or any combination thereof.

NVMs 128a-n may store metadata associated with the NVM. The metadata may include information that describes the data stored in NVMs 128a-n of NVM package 104. For example, the metadata can include temperature information that indicates a temperature of a portion of NVMs 128a-n over a period of time. The metadata may also include a variety of additional information such as timestamp information (e.g., the time at which a memory cell was last programmed) and wear information (e.g., information indicating the number of times various portions of NVM have been programmed and/or erased). In some embodiments, the metadata may store a composite index value incorporating temperature information, timestamp information, and/or wear information based upon a predictive data retention model, discussed in more detail below.

In some embodiments, metadata associated with NVMs 128a-n, including temperature information, timestamp information, wear information, and/or various index values, may be stored in page or block headers (e.g., portions of each page or block that can be dedicated to storing metadata). Storing this metadata in page and/or block headers may be appropriate as cycle counts, time elapsed, and temperature profiles may be localized factors specific to each block and/or page. Additionally or alternatively, this metadata may be stored in a separate table that can be easily accessed by memory controller 106 and/or host controller 114 to make performance throttling decisions. For example, during operation a table including metadata may be stored in volatile memory 122 and/or volatile memory 108.

Figure 2:
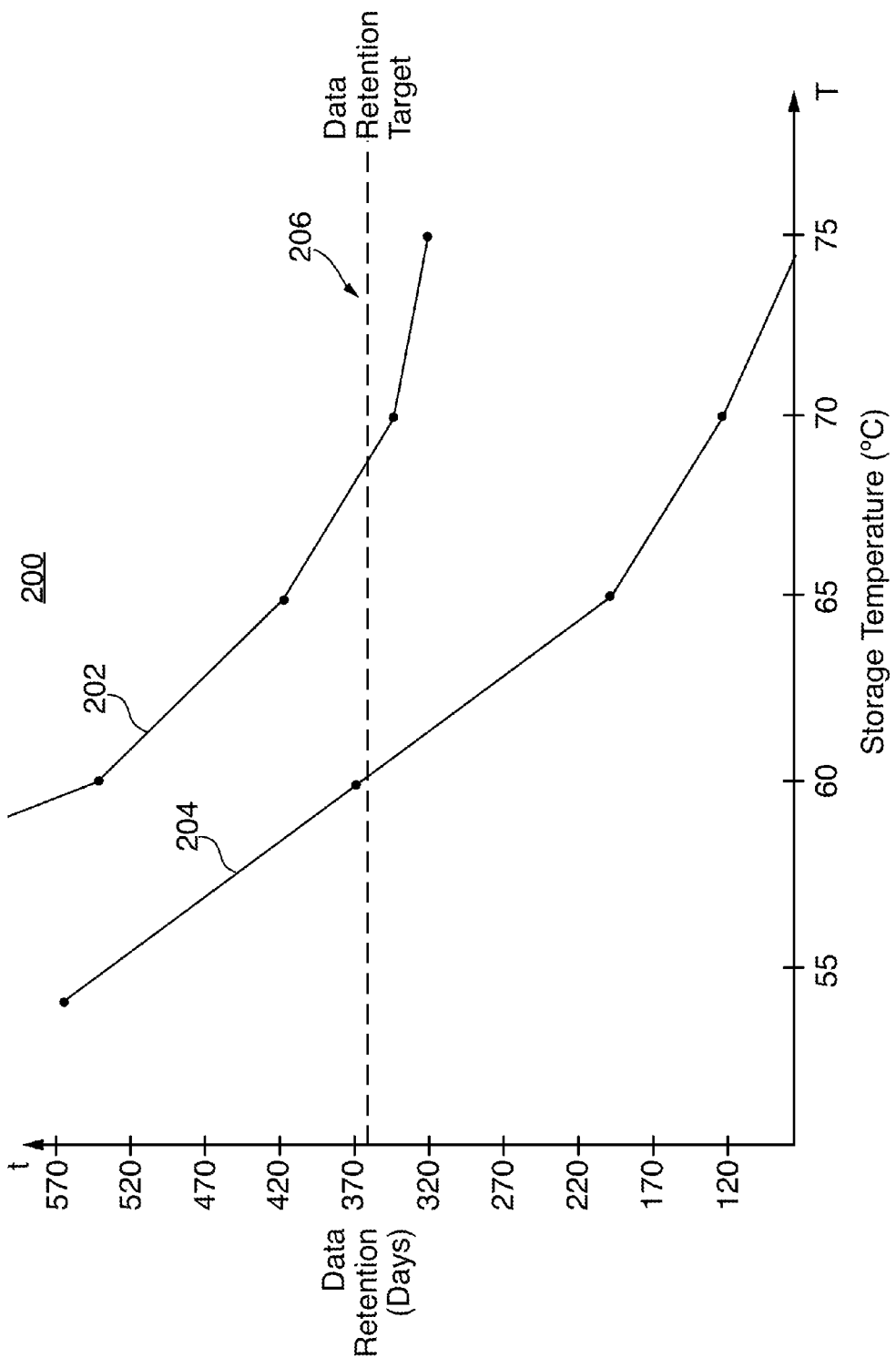
FIG. 2 depicts a graph of illustrative data retention curves as a function of storage temperature in accordance with various embodiments.

As noted above, NVM data retention can be inversely proportional to temperature (i.e., both storage temperature and operational temperature) and cycle count. These two factors, therefore, may determine how long data can be reliably stored in a portion of NVM. FIG. 2 depicts a graph 200 of illustrative data retention curves as a function of storage temperature. Graph 200 can include low cycle-count curve 202, high cycle-count curve 204, and data retention target 206.

Low cycle-count curve 202 and high cycle-count curve 204 can generally illustrate the dependence of data retention on storage temperature. Persons skilled in the art will appreciate that actual data retention may depend on a number of additional factors including, for example, design rules and tolerances, and/or whether the NVM includes single-level cells ("SLC") or multi-level cells ("MLC"). For example, if the NVM includes NAND memory, older devices with more less aggressive ground rules may exhibit better data retention than newer devices with more aggressively scaled ground rules. Additionally, because the voltage tolerances for SLCs may be more forgiving than for MLCs, data retention characteristics may be more favorable for SLCs.

Low cycle-count curve 202 and high cycle-count curve 204 may be used, therefore, to determine the amount of time that data may be stored at a particular temperature in a particular portion of the NVM. According to some embodiments, low cycle-count curve 202 and high cycle-count curve 204 can represent two different portions of the same NVM (e.g., two different NVM dies, blocks, pages, or memory cells) that have undergone a different number of program/erase cycles, where each program/erase cycle can increment the cycle count. The curves displayed on graph 200 curves may be simplified models that do not factor in any effects of additional program/erase cycles and/or temperature variance introduced from, for example, operating the NVM and environmental conditions.

One skilled in the art will appreciate that low cycle-count curve 202 and high cycle-count curve 204 could also represent different NVMs. For instance, low cycle-count curve 202 and high cycle-count curve 204 could represent an older less aggressively scaled NVM and a state-of-the-art, highly scaled NVM, respectively. Alternatively, low cycle-count curve 202 and high cycle-count curve 204 could represent SLC and MLC NVMs, respectively. In any of the above cases, the general relationship between the two curves on graph 200 would apply.

Data retention target 206 can represent the amount of time that data is required to be retained in an NVM system. Data retention target 206 may be a specification set by a vendor for a specific NVM and/or a requirement set by users of the NVM. In some cases, data retention target 206 may be set to meet consumer expectations based upon data characteristics of other NVMs in the marketplace, including older, less aggressively scaled devices. As one example, data retention target 206 may require that data be retained reliably for one year from the time it was programmed to the NVM.

A maximum storage temperature for the NVM system may be calculated if the data retention characteristics of a particular NVM system and the data retention target are known. For example, the NVM depicted by high cycle-count curve 204 must be stored at or below 60° C. NVM to meet data retention target 206. On the other hand, the NVM depicted by low cycle-count curve 202 can be stored at 65° C. while meeting the same data retention target 206.

Figure 3:
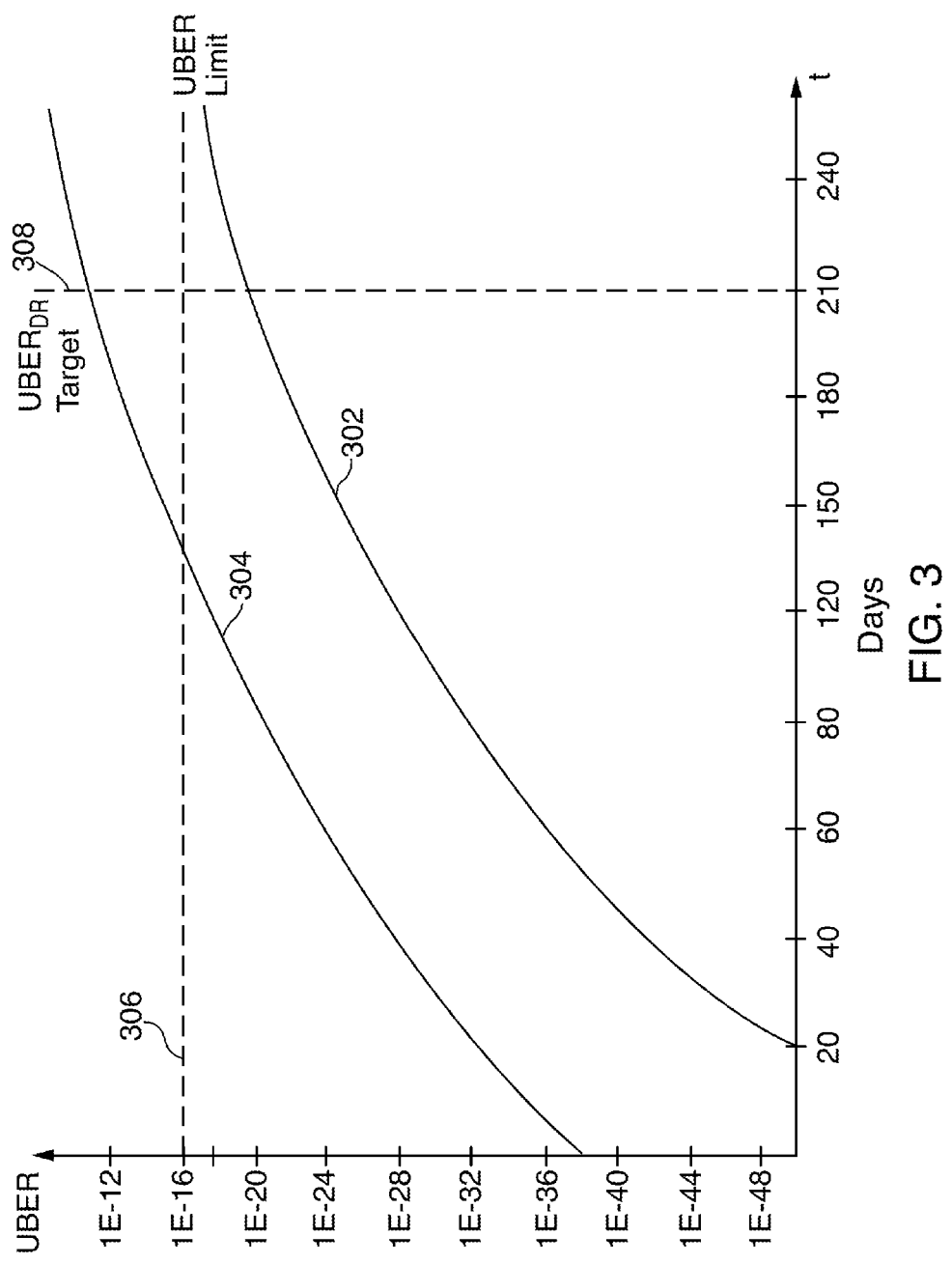
FIG. 3 depicts a graph of illustrative NVM bit error rates as a function of time in accordance with various embodiments.

FIG. 3 depicts a graph 300 of illustrative NVM bit error rates ("BER") as a function of time (temperature may be assumed to be held constant). Graph 300 can include low cycle-count curve 302, high cycle-count curve 304, data retention target 306 and uncorrectable $BER_{DR}$ ("$UBER_{DR}$") target 308. Low cycle-count curve 302 and high cycle-count curve 304 may correspond to the same or similar NVMs and cycle counts represented by low cycle-count curve 202 and high cycle-count curve 204 of FIG. 2. Similarly, data retention target 306 may correspond to data retention target 206 of FIG. 2.

As used herein, "BER" can refer to the number of bit errors divided by the number of bits in the NVM. "UBER" can refer to the number of bit errors that cannot be corrected by the ECC divided by the number of bits in the NVM. $UBER_{DR}$ can be a figure of merit that defines the minimum UBER for data reliability in the NVM to be considered acceptable. For example, once an NVM system reaches a UBER of $1e^{-14}$, data stored in the NVM may longer be considered reliable. According to some embodiments $UBER_{DR}$ can be used to define data retention characteristics by determining how long a particular NVM takes to reach the $UBER_{DR}$ limit.

In the case depicted in graph 300, high cycle-count curve 304 intersects $UBER_{DR}$ target 308 before reaching data retention target 306, which may indicate that the NVM portion represented by high cycle-count curve 304 is not expected to meet its data retention target. On the other hand, low cycle-count curve 302 intersects $UBER_{DR}$ target 308 after reaching data retention target 306, indicating that the NVM portion represented by low cycle-count curve 302 is expected to meet its data retention target.

As shown in graph 300, UBER may generally increase with the amount of time elapsed since the NVM was last programmed. The rate at which UBER increases with time can also depend on the temperature of the NVM.

Figure 4:
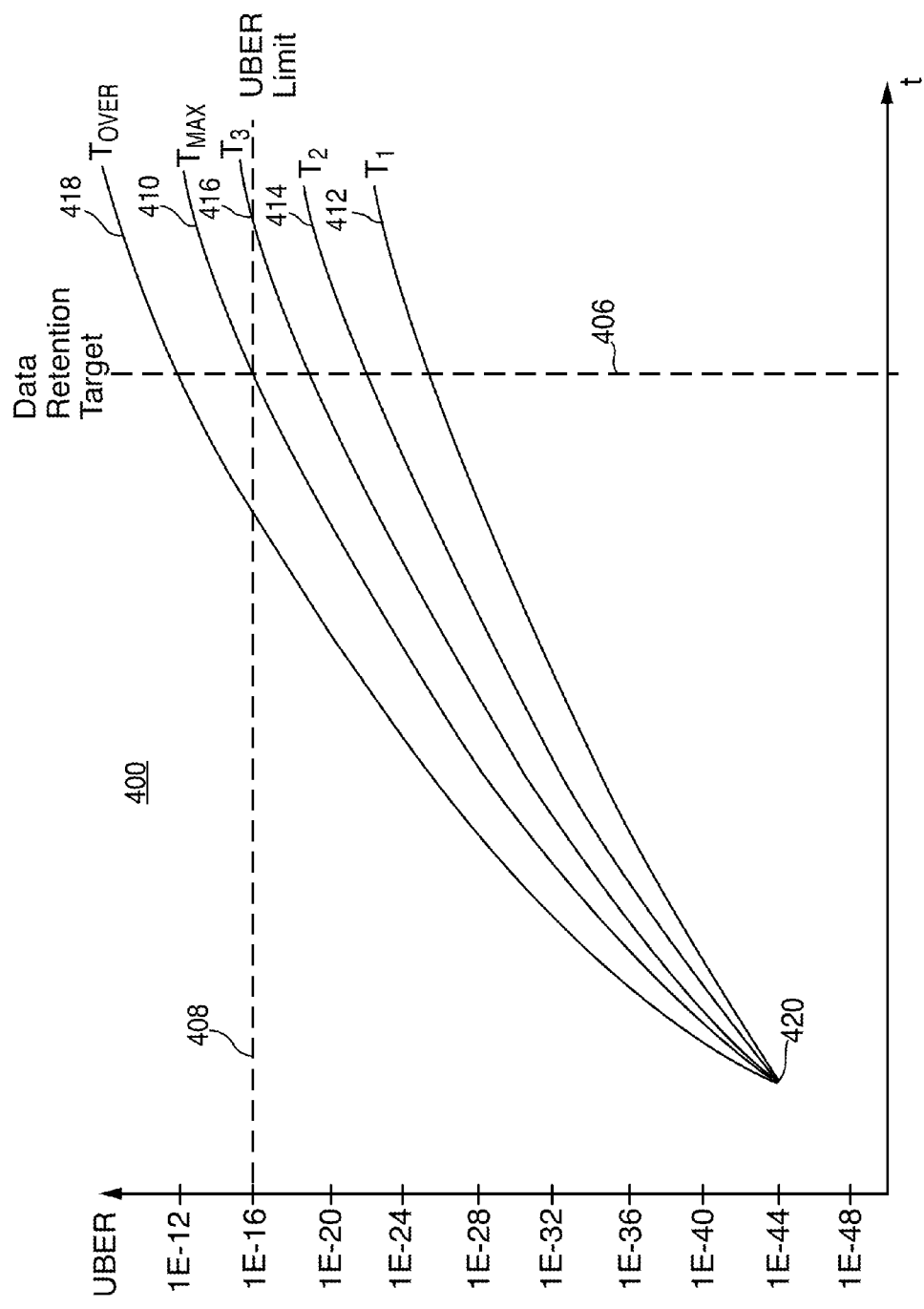
FIG. 4 depicts a graph of illustrative NVM bit error rates as a function of time at various storage temperatures in accordance with various embodiments.

FIG. 4 depicts a graph 400 of illustrative NVM BERs as a function of time at various storage temperatures. Graph 400 can include $T_{max}$ curve 410, $T_1$ curve 412, $T_2$ curve 414, $T_3$ curve 416, and $T_{over}$ curve 418. These curves can illustrate how temperature can impact the relationship between BER for a portion of NVM and time elapsed since that portion of NVM was programmed. Each curve from $T_1$ curve 412 to $T_{over}$ curve 418 may represent the same NVM portion stored at increasingly high temperatures.

$T_{max}$ curve 410 can represent the BER vs. time curve that intersects data retention target 406 and $UBER_{DR}$ target 408 at the same point. Thus, $T_{max}$ can be the maximum temperature at which the NVM can be stored while meeting a specified data retention target. If the NVM is stored at $T_{over}$, the UBER may exceed $UBER_{DR}$ target 408 before reaching data retention target 406. On the other hand, the NVM may be stored at $T_1$, $T_2$, or $T_3$ (i.e., temperatures less than $T_{max}$), to meet data retention target 406.

Throttling point 420 may represent the point at which the NVM system begins to throttle performance to ensure that a data retention target is met. Any suitable method may be chosen to determine throttling point 420. According to some embodiments, throttling point 420 can be chosen such that $T_{max}$ corresponds to the maximum temperature of which the NVM is expected to be subjected. For example, if the NVM system is expected to reach a maximum of 90° C. during operation, throttling point 420 may be chosen such that $T_{max}$ curve 410 corresponds to a $T_{max}$ of 90° C. This method may have the benefit of only requiring performance throttling when the NVM temperature exceeds the maximum expected temperature. However, this conservative method may introduce performance throttling very early on in the NVM's lifetime. Moreover, in many scenarios, the maximum expected temperature will be higher than $T_{max}$ no matter how early performance throttling is initiated.

In some embodiments, throttling point 420 may be chosen to correspond to a particular cycle count for a portion of an NVM as memory cell charge loss may occur more slowly for low cycle counts than for high cycle counts. Therefore, the NVM system may only begin throttling performance when a portion of NVM reaches a threshold cycle count. For example, the NVM system may begin throttling performance when a portion of the NVM reaches a predetermined number (e.g., 3,000) of program/erase cycles. In such embodiments, $T_{max}$ may be calculated as the maximum storage temperature for the NVM at the threshold cycle count.

According to further embodiments, throttling point 420 may be chosen when a portion of the NVM exceeds a threshold UBER. A raw BER ("RBER"), or the fraction of bits that contain incorrect data before ECC is employed, may be measured periodically for portions of NVM in an NVM system. For example, the RBER for a portion of the NVM may be determined by an ECC algorithm during a read operation. The UBER can be calculated from the RBER as follows:

$$UBER = \frac{\sum_{n=E+1}^{N} \binom{N}{n} \times RBER^n \times (1 - RBER)^{N-n}}{\# \text{ User Bits per Codeword}} \quad (1)$$

where E can represent the number of failing bits per codeword that the ECC can correct and N can represent the number of bits per codeword. A "codeword" may be defined as a combination of user bits and parity bits used by the ECC algorithm to detect and correct errors. For instance, a codeword may include a 512-byte sector of user data in addition to a number or parity bits. Accordingly, performance throttling may begin once a UBER for a portion of the NVM is determined to exceed a certain predetermined threshold.

Performance throttling may include reducing the number of active NVM dies in the NVM system. For example, if an NVM system includes n NVM dies (e.g., NVM dies 112*a-n* of FIG. 1), a portion of those dies may be deactivated to reduce the operating temperature of the NVM system. If a maximum operating temperature ($T_{max}$) is determined as described above, the maximum number of NVM dies that may be run in parallel may be calculated as follows:

$$\#NVM \ dies_{max} = \frac{T_{max} - T_{env}}{T_{die}} \quad (2)$$

where $T_{env}$ represents the ambient temperature of the NVM system, which may be measured by one or more temperature sensors of the NVM system (e.g., ambient temperature sensor(s) 134 and/or temperature sensor(s) 130 of FIG. 1). $T_{die}$ may represent the temperature added to the system by each active NVM die. In some cases, $T_{die}$ may be as high as 4-5° C. or more. Accordingly, by reducing the number of active NVM dies in an NVM system, the temperature of the system can be actively controlled at or below $T_{max}$.

According to some embodiments, performance throttling may be based on a worst case portion of the NVM. Because different portions of the NVM may have different cycle counts and different temperature profiles, data retention characteristics may vary throughout the NVM. For example, a block of NVM with a cycle count of 2,500 that has been stored at 50° C. may be able to store data reliably for a longer period of time than a block of the same NVM with a cycle count of 5,000 that has been stored at a temperature of 70° C. Accordingly, the NVM system may throttle performance in order to preserve data stored in the worst-case portion of the NVM. The worst-case portion of the NVM may be determined based upon, for example, the UBER for that portion of the NVM or any suitable function of cycle count, temperature, and/or time elapsed since the portion was last programmed.

FIGS. 2-4, described above, may represent a simplified model of the dependency of NVM retention time as a function of cycle count and temperature. In particular, during operation of the NVM, global (e.g., system wide) and local (e.g., block, page, and/or memory cell level) temperatures can change significantly. Accordingly, a model that accounts for varying temperatures in an NVM system may allow for more accurate determinations of when and to what degree performance should be throttled.

Figure 5:
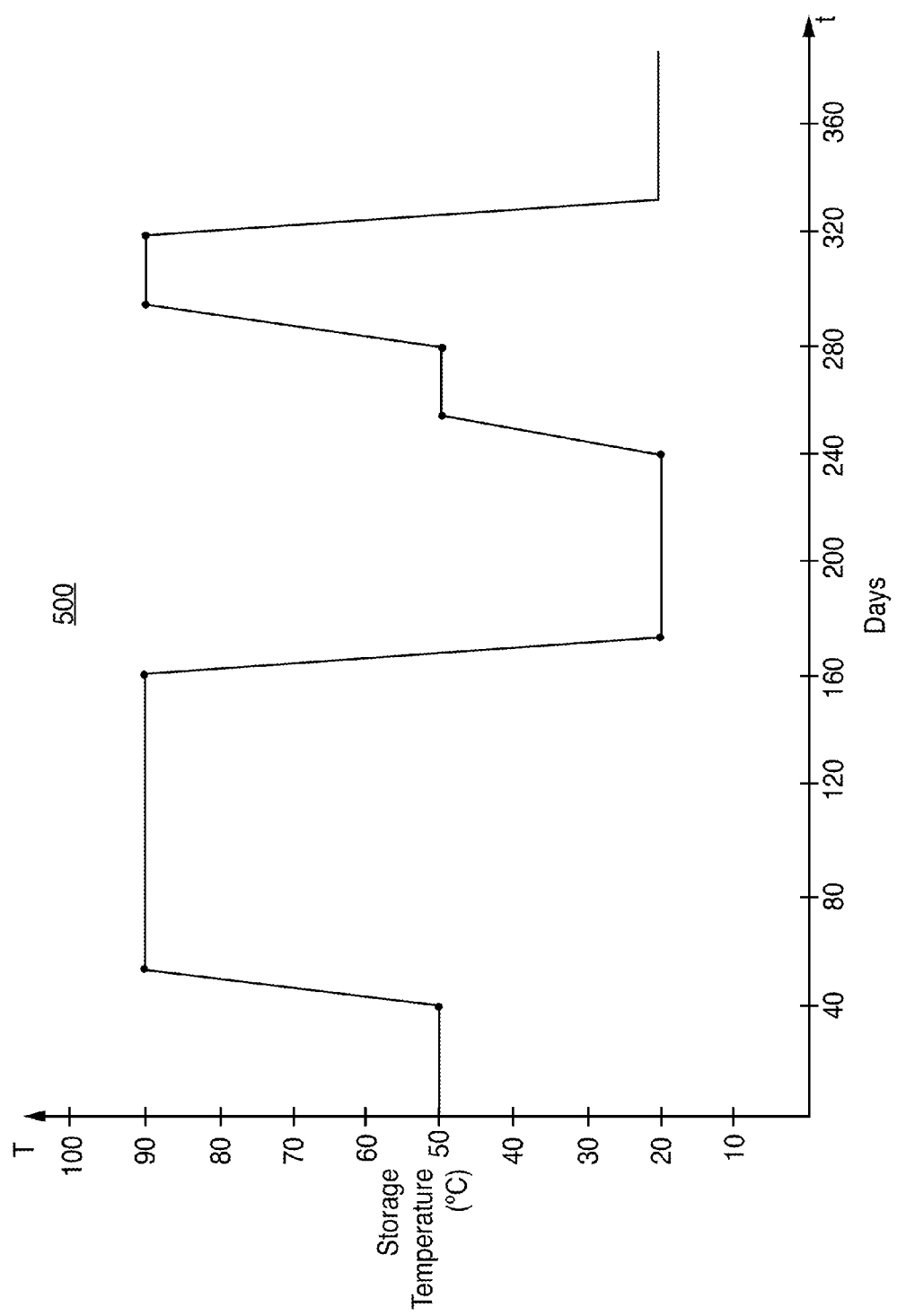
FIG. 5 depicts a graph of an illustrative temperature profile in accordance with various embodiments.

FIG. 5 depicts a graph of an illustrative temperature profile 500 in accordance with some embodiments. Temperature profile 500 may represent the temperature profile for an NVM or a portion of an NVM (e.g., an NVM die, a block, a page, or a memory cell) over the course of one year. According to some embodiments, temperature profiles may be stored for any length of time. For example, an NVM system (e.g., system 100 of FIG. 1) may begin storing temperature profiles from the time the NVM is first programmed. Alternatively, the NVM system may wait until a certain cycle count has been reached (e.g., 3000 program/erase cycles) before beginning to store temperature profiles about portions of the NVM.

Temperature measurements for temperature profile 500 may be made at any suitable interval. For example, temperature measurements can be taken continuously while the NVM system is powered on. Alternatively, temperature measurements may be taken at regular intervals (e.g., once a minute or once a day). According to some embodiments, temperature measurements may be taken when the portion of the NVM associated with the temperature profile is active (e.g., being programmed, erased, or read from). Still further, temperature measurements may be taken continuously or at relatively short intervals (e.g., once per second or once per minute), but only stored when a change in temperature above a predetermined threshold is measured. For example, the NVM system may only store temperature information in temperature profiles if a change of more than 5° C. is detected from the last recorded temperature.

Temperature profile 500 may be stored in any suitable memory within an NVM system. According to embodiments in which temperature profile 500 represents the temperature profile for a small portion of the NVM within an NVM system (e.g., a block, a page, or an individual memory cell), temperature profile 500 can be stored as metadata associated with that portion of the NVM. In particular, temperature profile 500 can be stored as metadata in a block or page header associated with the block, page, or memory cell referenced by the temperature profile.

Additionally or alternatively, temperature profile 500 may be stored elsewhere within the NVM system. In some embodiments, temperature profile 500 may be stored persistently in a dedicated table in NVM (e.g., in NVMs 128a-n of FIG. 1) along with one or more other temperature profiles. For example, such a dedicated table may include separate temperature profiles for each NVM die, each block, page, or memory cell in each NVM die, and/or the entire NVM. During operation of the NVM, the dedicated table may be transferred to a volatile memory (e.g., volatile memory 122 of FIG. 1).

For a portion of NVM with temperature profile 500, the smooth shapes of low cycle-count curve 302 and high cycle-count curve 304 of FIG. 3 may not be a realistic depiction of the relationship between UBER and time. For example, each change in temperature in temperature profile 500 may have the effect of altering the slopes of low cycle-count curve 302 and high cycle-count curve 304. Accordingly, the relationship between UBER and time for a portion of an NVM may be more appropriately modeled as a piecewise function of temperature and storage time.

Figure 6:
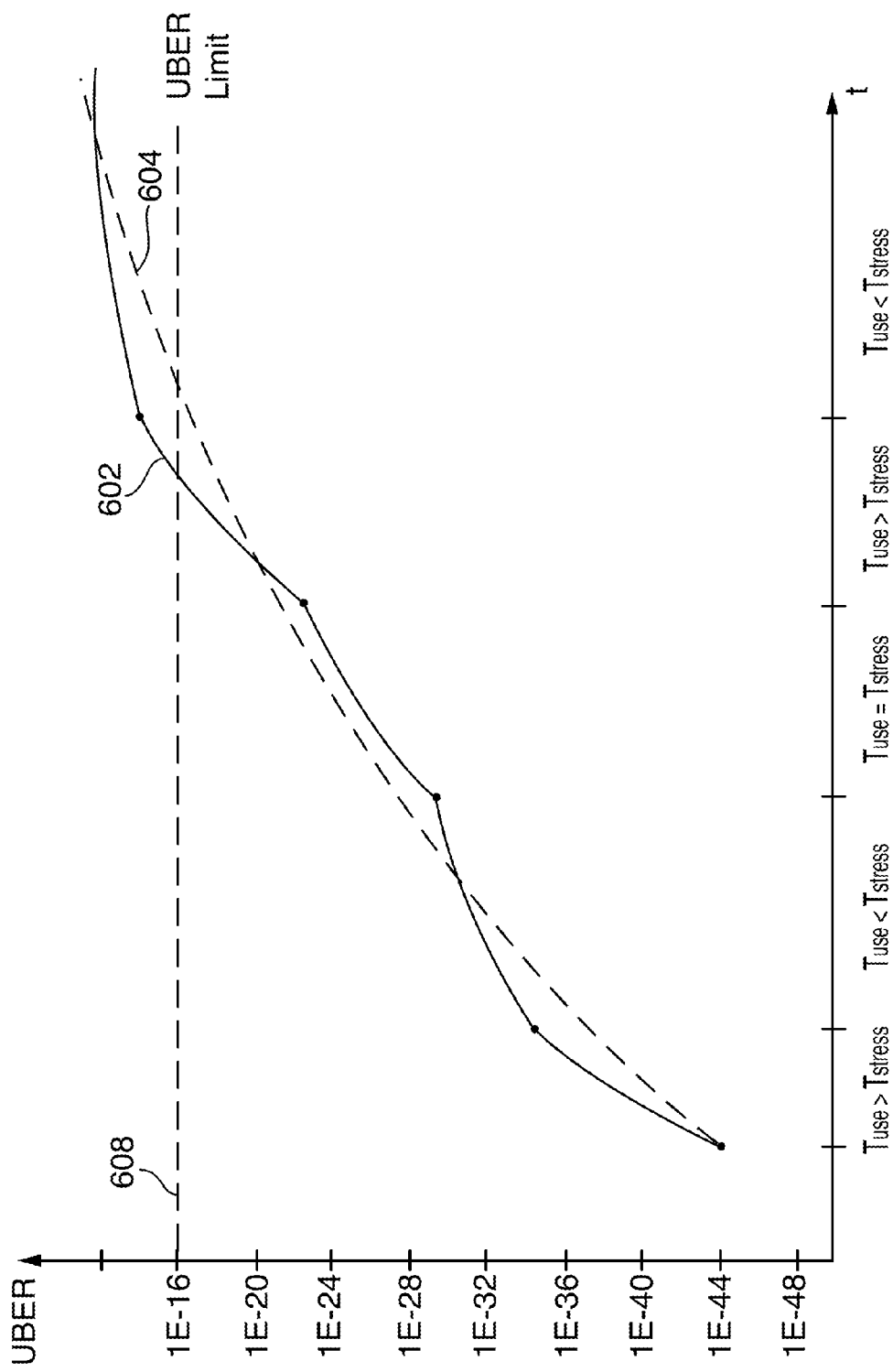
FIG. 6 depicts a graph of an illustrative piecewise NVM uncorrectable bit error rate curve as a function of time in accordance with various embodiments.

FIG. 6 depicts a graph 600 of an illustrative piecewise NVM UBER curve 602 as a function of time. Total $UBER_{DR}$ can be calculated as the piecewise sum of the $UBER_{DR}$ as a function of use temperature, T or $T_{use}$, and the amount of time (t) the portion of the NVM was exposed to that temperature. Accordingly, using a piecewise Arrhenius Equation, total $UBER_{DR}$ may be calculated as follows:

$$UBER_{DR}(T,t) = \Sigma_{i=0}^{n-1} UBER_{DR}(T_i, t_i) \times (t_i - t_{i-1}) \times AF(T_i) \quad (3)$$

where $AF(T_i)$ can be calculated as follows:

$$AF(T_i) = \exp\left(\frac{E_a}{k}\left(\frac{1}{T_{use}} - \frac{1}{T_{stress}}\right)\right) \quad (4)$$

where $T_{stress}$ may represent a reference temperature at which a dependence of UBER on time for the NVM has been characterized. For example, referring to FIG. 5, $T_{stress}$ may be an average operating temperature (e.g., 50° C.), a minimum temperature (e.g., 20° C.), or a maximum temperature (e.g., 90° C.). $E_a$ can represent the activation energy of the NVM. The value of $E_a$ may, according to some embodiments, be determined empirically during, for example, characterization of the NVM. k may represent a natural or system-specific constant (e.g., the Boltzmann constant).

As depicted in FIG. 6, the slope of each segment of piecewise NVM UBER curve 602 can depend on $T_{use}$. For reference, piecewise NVM UBER curve 602 may be compared to $T_{stress}$ NVM UBER curve 604, which can represent the relationship between UBER and time if the portion of the NVM is stored at $T_{stress}$.

FIG. 7 is a flowchart of an illustrative process 700 for NVM performance throttling. Process 700 can begin at step 701 in which stored temperature information and cycle count data associated with a portion of an NVM memory system can be received. The temperature information and cycle count data may be stored in any suitable location of the NVM memory system including, for example, in volatile or nonvolatile memory (e.g., volatile memory 122 or NVMs 128a-n of FIG. 1, respectively). The temperature information may be stored as a temperature profile for the portion of the NVM (e.g., temperature profile 500 of FIG. 5). According to some embodiments, the temperature information may be stored in a dedicated table that includes the temperature and cycle count information for multiple portions of the NVM. Alternatively, the temperature information and cycle count information may be stored as metadata in the portion of the NVM associated with which it is associated.

At step 703, a maximum temperature ($T_{max}$) for storing data in the portion of the NVM to meet a predetermined data retention target may be determined. For example, if data is required to be reliably stored in in the NVM for a period of one year, a memory controller (e.g., memory controller 106 of FIG. 1) can determine the maximum temperature at which the NVM can be stored in order to meet that requirement. The maximum temperature may be determined such that the UBER for that portion of the NVM does not exceed a predetermined value (e.g., $1e^{-14}$) during the one-year data retention period.

In some embodiments, $T_{max}$ may be continually recalculated based on changing system conditions. For instance, $T_{max}$ may be calculated based on the worst-case portion of the NVM as determined based upon temperature profiles, cycle counts, and/or time elapsed since the portion was last programmed. Accordingly, if the worst-case portion of the NVM is erased and reprogrammed, that portion may no longer be suitable for calculating $T_{max}$. Instead, a new portion of the NVM may need to be selected as the worst-case portion. Additionally, as cycle counts increase and temperature profiles evolve, $T_{max}$ may need to be readjusted in order to meet data retention requirements.

At step 705, performance of the memory system may be throttled to keep the system temperature at or below $T_{max}$. According to some embodiments, performance throttling may include reducing the number of active NVM dies in the system in order to reduce the overall system temperature. In order to avoid affecting the user experience, performance may be throttled when the system is idle, and the number of active dies can be increased only when required (e.g., an incoming read command is addressed to an inactive NVM die).

It should be understood that process 700 of FIG. 7 is merely illustrative. Any of the steps may be removed, modified, or combined, and any additional steps may be added, without departing from the scope of the invention.

While there have been described systems and methods for nonvolatile memory performance throttling, it is to be understood that many changes may be made therein without departing from the spirit and scope of the invention. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The described embodiments of the invention are presented for the purpose of illustration and not of limitation.

What is claimed is:

1. A method for maximizing data retention in a memory system, the method comprising:
   receiving temperature information and cycle count data associated with a portion of a nonvolatile memory ("NVM") of the memory system from a memory of the memory system;
   determining a maximum temperature for storing data in the portion of the NVM to meet a predetermined data retention target based on the retrieved temperature information and the cycle count data; and
   throttling the performance of the memory system based at least in part on to the determining, wherein the throttling the performance comprises deactivating a first subset of NVM dies such that a second subset of NVM dies are not deactivated, wherein the maximum number of NVM dies in the second subset is calculated as the maximum temperature minus an environmental temperature of the memory system divided by a temperature added to the memory system by each active NVM die of the memory system.

2. The method of claim 1, wherein throttling the performance of the memory system comprises throttling performance to keep at a system temperature one of at and below the maximum temperature.

3. The method of claim 1, wherein throttling the performance of the memory system comprises limiting a number of NVM dies that are currently active in the memory system.

4. The method of claim 1, wherein the temperature information and cycle count data are stored in the NVM as metadata associated with the portion of the NVM.

5. The method of claim 1, wherein the temperature information and cycle count data are stored in a table stored in at least one of the NVM and a volatile memory of the memory system.

6. The method of claim 1, wherein throttling the performance of the memory system begins after the portion of the NVM reaches a predetermined cycle count.

7. The method of claim 1, wherein throttling the performance of the memory system begins after the portion of the NVM reaches a threshold uncorrectable bit error rate ("UBER").

8. The method of claim 7, wherein the UBER is calculated as a piecewise function of temperature and storage time.

9. The method of claim 1, wherein the temperature information comprises temperature measurements of the portion of the NVM measured one of:
   continuously;
   at regular intervals; and
   when the portion of the NVM is being programmed, erased, or read.

10. The method of claim 1, wherein the temperature information is only stored when a change in temperature is measured that exceeds a predetermined threshold.

11. A nonvolatile memory ("NVM") system, comprising:
    a memory controller;
    a plurality of NVM dies comprising NVM and communicatively coupled to the memory controller over a first bus;
    at least one temperature sensor configured to measure a temperature of the plurality of NVM dies, wherein the memory controller is configured to throttle NVM performance by deactivating a first subset of the plurality of NVM dies based on at least one of:
       the temperature of the plurality of NVM dies;
       a cycle count of a portion of the NVM; and
       a time elapsed since the portion of the NVM was last programmed;
    wherein the memory controller is configured to calculate a maximum temperature for the NVM, and wherein the maximum temperature is a temperature at which the NVM may be stored to achieve a predetermined data retention target; and
    a second subset of NVM dies that are not deactivated by the memory controller, wherein the maximum number of NVM dies in the second subset is calculated as the maximum temperature minus an environmental temperature of the NVM system divided by a temperature added to the NVM system by each active NVM die of the NVM system.

12. The NVM system of claim 11, wherein each NVM die of the plurality of NVM dies comprises at least one of the at least one temperature sensor.

13. The NVM system of claim 11, wherein the memory controller begins to throttle performance of the NVM when the maximum temperature corresponds to the highest temperature to which the NVM is expected to be subjected.

14. The NVM system of claim 11, wherein the memory controller begins to throttle performance of the NVM when the portion of the NVM reaches a predetermined cycle count.

15. The NVM system of claim 11, wherein the memory controller begins to throttle performance of the NVM when the portion of the NVM exceeds a threshold uncorrectable bit error rate ("UBER").

16. The NVM system of claim 15, wherein the UBER is calculated as a function of a raw bit error rate ("RBER") and characteristics of an error checking and correction algorithm used by the NVM.

17. The NVM system of claim 11, wherein the environmental temperature is measured with one or more of the at least one temperature sensors.

* * * * *